United States Patent
Kameda et al.

(10) Patent No.: US 6,703,857 B2
(45) Date of Patent: Mar. 9, 2004

(54) INTEGRATED CIRCUIT OF SUPERCONDUCTING CIRCUIT BLOCKS AND METHOD OF DESIGNING THE SAME

(75) Inventors: Yoshio Kameda, Tokyo (JP); Shinichi Yorozu, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/201,965

(22) Filed: Jul. 25, 2002

(65) Prior Publication Data

US 2003/0034794 A1 Feb. 20, 2003

(30) Foreign Application Priority Data

Aug. 17, 2001 (JP) .......................... 2001-247896

(51) Int. Cl.[7] .............................................. H03K 19/195
(52) U.S. Cl. .................... 326/1; 326/3; 326/6; 326/7
(58) Field of Search ............................... 326/1–7

(56) References Cited

U.S. PATENT DOCUMENTS 4,518,868 A * 5/1985 Harada et al. ............... 327/528
6,242,939 B1 * 6/2001 Nagasawa et al. ............. 326/3

OTHER PUBLICATIONS

C.A. Hamilton et al., "Margins and Yield in Single Flux Quantum Logic", IEEE Transactions on Applied Superconductivity, vol. 1, No. 4, Dec. 1991, pp. 157–163 with Abstract.

K.K. Likharev et al., "RSFQ Logic / Memory Family: A New Josephson–Junction Technology for Sub–Terahertz–Clock–Frequency Digital Systems", IEEE Transactions on Applied Superconductivity, vol. 1, No. 1, Mar. 1991 with Abstract.

* cited by examiner

*Primary Examiner*—Vibol Tan
(74) *Attorney, Agent, or Firm*—Sughrue Mion, PLLC

(57) ABSTRACT

An integrated circuit comprises plural superconducting circuit blocks connected through superconducting wiring strips, and each superconducting circuit block includes at least one superconducting logic circuit, constant input/output circuits connected between the input/output nodes of the circuit block and the superconducting logic circuit; parameters of the constant input/output circuits are regulated such that statically flow-in/flow-out current is approximately equal to zero at the input/output nodes of the superconducting logic circuit, whereby the superconducting logic circuit operates at the optimum operating point after the integration.

13 Claims, 5 Drawing Sheets

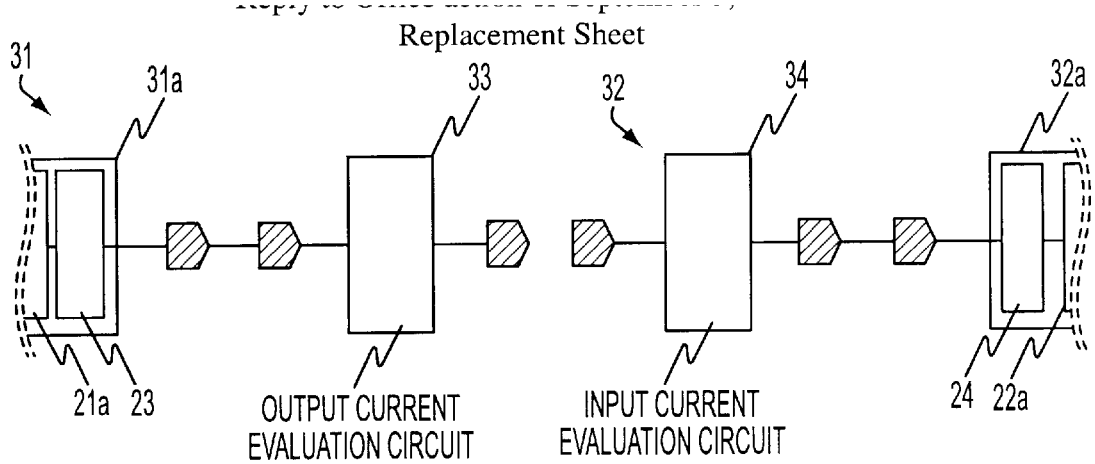
Fig. 4A
Fig. 4B
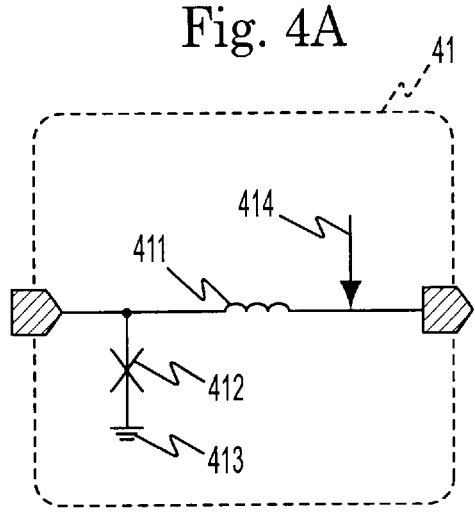
Fig. 5A
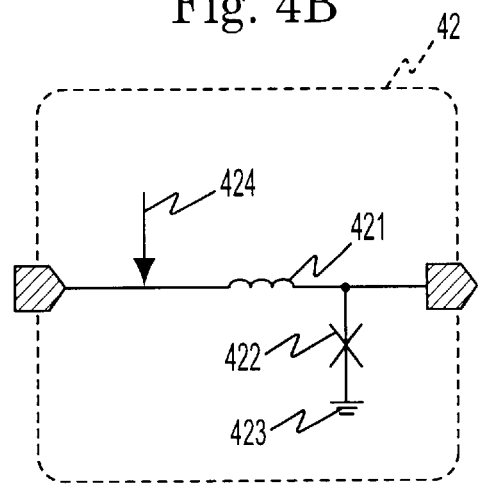
Fig. 5B
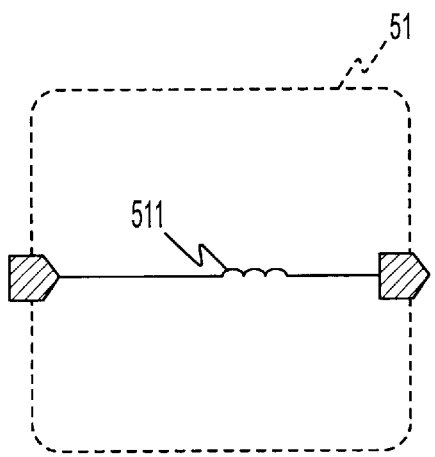
Fig. 5C
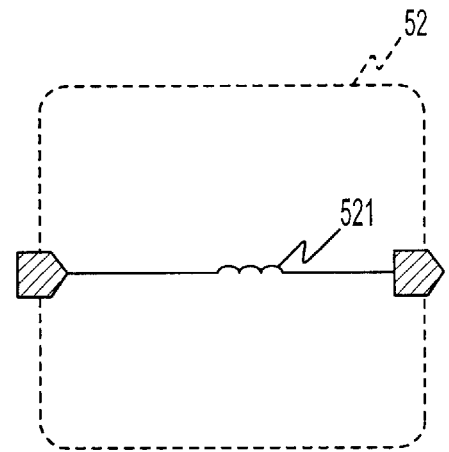
Fig. 5D

INTEGRATED CIRCUIT OF SUPERCONDUCTING CIRCUIT BLOCKS AND METHOD OF DESIGNING THE SAME

FIELD OF THE INVENTION

This invention relates to an integrated circuit of superconducting devices and, more particularly, to an integrated circuit consisting of plural superconducting circuit blocks and a method for designing the integrated circuit.

DESCRIPTION OF THE RELATED ART

An integrated superconducting logic circuit comprises plural superconducting circuit blocks and superconducting wiring strips selectively connected between the superconducting circuit blocks. The superconducting circuit blocks carry out basic logical operations on input signals, and the output signals are propagated through the superconducting wiring strips. A circuit configuration of the simple rapid single flux quantum logic gates, i.e., RSFQ logic circuits and a connection between the superconducting circuits are disclosed by K. K. Kikharev et. al. in "RSFQ Logic/Memory Family: A New Josephson-Junction Technology for Sub-Terahertz- Clock- Frequency Digital Systems", IEEE Transactions on Applied Superconductivity, vol. 1, No. 1, pages 3 to 28, March 1991.

FIGS. 1A to 1C illustrate the current flowing in the prior art superconducting circuit blocks. In FIGS. 1A and 1B, superconducting circuit blocks 91 and 92 are connected to each other through a superconducting wiring strip 93, and the superconducting circuit blocks 95 and 96 are connected to each other through a superconducting wiring strip 97. The superconducting circuit block 91 is same in circuit configuration as the superconducting circuit block 95, and achieves a certain logic operation on input signals. The superconducting circuit block 92 is different in circuit configuration from the superconducting circuit block 96. However, it is not a problem that the superconducting circuit block 92 is same in circuit configuration as the superconducting circuit block 96.

When the superconducting circuit block 92 achieves the task, the superconducting circuit block 92 outputs static current 94 through the superconducting wiring strip 93 to the superconducting circuit block 91. This results in that the superconducting circuit block 91 is statically with the current more than the current flowing through the superconducting circuit block 91 in the isolated state due to the connection to the superconducting circuit block 92.

Similarly, the superconducting circuit block 95 supplies static current 98 through the superconducting wiring strip 97 to the superconducting circuit block 96. Accordingly, the superconducting circuit block 95 is statically supplied with current less than the current flowing through the superconducting circuit block 95 in the isolated state.

FIG. 1C illustrates the amount of current supplied to each of the superconducting circuit blocks 91 and 95. When the superconducting circuit blocks 91/95 are isolated, the operating range is represented by a block A. In order to give the maximum margin to the superconducting circuit blocks 91/95, the superconducting circuit blocks 91/95 are designed to have the amount of supply current at mid point A1 of the operating range A. When the superconducting circuit block 92 is connected to the superconducting circuit block 91, the amount of supply current is increased as described hereinbefore, and is moved to point A2. On the other hand, when the superconducting circuit block 95 is connected to the superconducting circuit block 96, the amount of current is decreased, and is moved to point A3.

Although point A2 is within the operating range, the margin is reduced. When the supply current is moved to point A3, which is out of the operating range A, the superconducting circuit block 95 becomes inoperative. The amount of supply current is regulable by changing design parameters of the superconducting circuit blocks. In order words, the supply current to each of the superconducting circuit blocks connected to one another is optimized at the mid point A1 by changing the design parameters for each superconducting circuit block. However, a large amount of time and labor is consumed in the optimization. Even though the superconducting circuit blocks such as those labeled with 91 and 95 are identical in circuit configuration with one another, the optimum set of design parameters is different between the superconducting circuit blocks 91 and 95, because the quantity and direction are different between the static current 94 and the static current 98. If a few superconducting circuit blocks form in combination an integrated circuit, the optimization will be not complicated. However, in case where a large number of superconducting circuit blocks are integrated into a complicated circuit, the optimization is a hard work.

Clark A. Hamilton et. al. report the optimization of parameters for the superconducting circuit blocks of a large scale integration to be difficult (see "Margins and Yield in Single Flux Quantum Logic", IEEE Transactions on Applied Superconductivity, Vol. 1, No. 4, pages 157 to 163, December 1991). Thus, the prior art integrated circuit of the superconducting circuit blocks has a problem in that the optimization is difficult due to a large number of parameters to be considered in the optimization of the supply current.

This problem is inherent in the superconducting circuit, because it is difficult to separate an input signal from an output signal. On the contrary, input signals are separated from output signals in semiconductor large-scale integrated circuits, and the optimization work is not required for the semiconductor large-scale integrated circuits.

SUMMARY OF THE INVENTION

It is therefore an important object of the present invention to provide an integrated circuit of superconducting circuit blocks in which the amount of supply current to each superconducting circuit block is approximately equal to zero without changing parameters of the superconducting circuit block.

It is also an important object of the present invention to provide a method of designing an integrated circuit of the superconducting circuit blocks.

In accordance with one aspect of the present invention, there is provided a integrated circuit comprising a first superconducting circuit block including an output node, a first superconducting circuit for a certain function and a constant output circuit connected between an output node of the first superconducting circuit and the output node and making the amount of statically flow-in or flow-out current at an output node of the first superconducting circuit approximately equal to zero, and a second superconducting circuit block including an input node, a second superconducting circuit for a certain function and a constant input circuit connected between the input node and an input node of the second superconducting circuit and making the amount of statically flow-in or flow-out current at the input node of the second superconducting circuit approximately equal to zero.

By virtue of the constant output circuit and constant input circuit, the amount of statically flow-in and/or flow-out current is approximately equal to zero so that the superconducting circuit blocks are simply integrated without changing parameters of the superconducting circuits.

In accordance with another aspect of the present invention, there is provided a method of designing an integrated circuit of superconducting circuit blocks comprising the steps of a) determining a first superconducting circuit block having a constant output circuit, a second superconducting circuit block having a constant input circuit, an output current evaluation circuit and an input current evaluation circuit, b) determining parameters of the output current evaluation circuit and parameters of the input current evaluation circuit in such a manner that the amount of current is approximately equal to zero at an output node of the output current evaluation circuit connected to an input node of the input current evaluation circuit, c) separating the output current evaluation circuit from the input current evaluation circuit, d) connecting an input node of the output current evaluation circuit and an output node of the input current evaluation circuit to an output node of the constant output circuit and an input node of the constant input circuit, respectively, e) determining parameters of the constant output circuit and parameters of the constant input circuit in such a manner that the amounts of current are approximately equal to zero at the output node of the constant output circuit and at the input node of the constant input circuit, independently, f) disconnecting the output current evaluation circuit and the input current evaluation circuit from the constant output circuit and the constant input circuit, respectively and g) connecting the output node of the constant output circuit to the input node of the constant input circuit so as to integrate the first superconducting circuit block and the second superconducting circuit block together.

BRIEF DESCRIPTION OF THE DRAWINGS

The features and advantages of the integrated circuit of superconducting blocks will be more clearly understood from the following description taken in conjunction with the accompanying drawings, in which FIGS. 4A and 4B are block diagrams showing other signal paths incorporated in one of the superconducting circuit blocks according to the present invention, FIG. 5A is a circuit diagram showing a circuit configuration of a constant output circuit incorporated in the signal paths, FIG. 5B is a circuit diagram showing a circuit configuration of a constant input circuit incorporated in the signal paths, FIG. 5C is a circuit diagram showing another circuit configuration of a constant output circuit incorporated in the signal paths, FIG. 5D is a circuit diagram showing another circuit configuration of a constant input circuit incorporated in the signal paths.

DESCRIPTION OF THE PREFERRED EMBODIMENTS

Integrated Circuit

Figure 1:
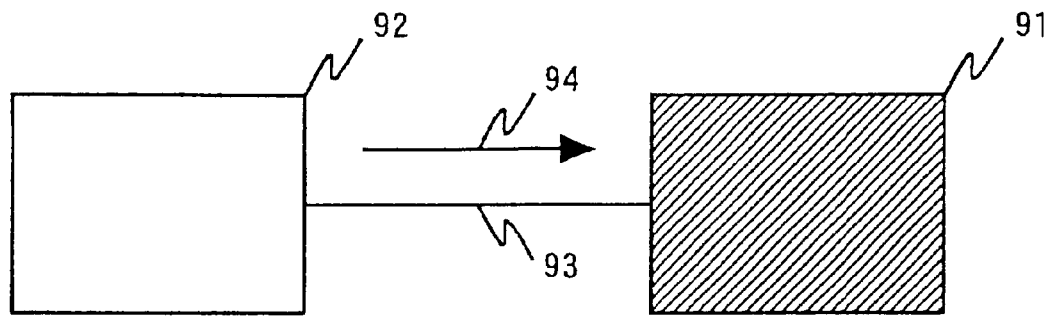
FIGS. 1A and 1B are block diagrams showing the connections between the prior art superconducting circuit blocks.
FIG. 1C is a view showing the amount of current supplied and to be supplied to the prior art superconducting circuit blocks.
Figure 1:
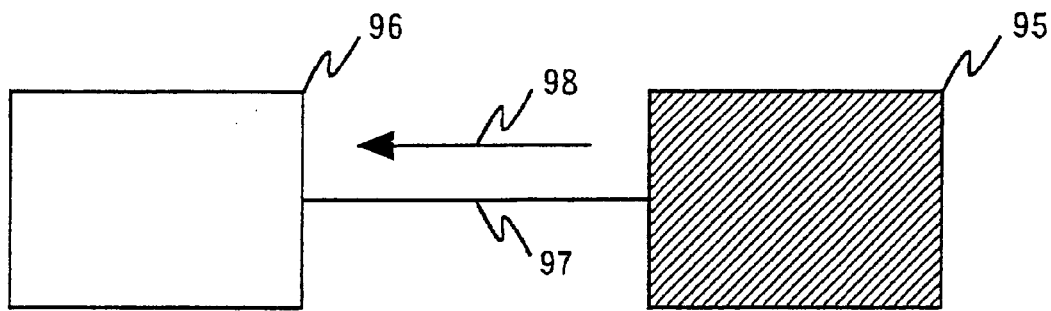
Figure 1:
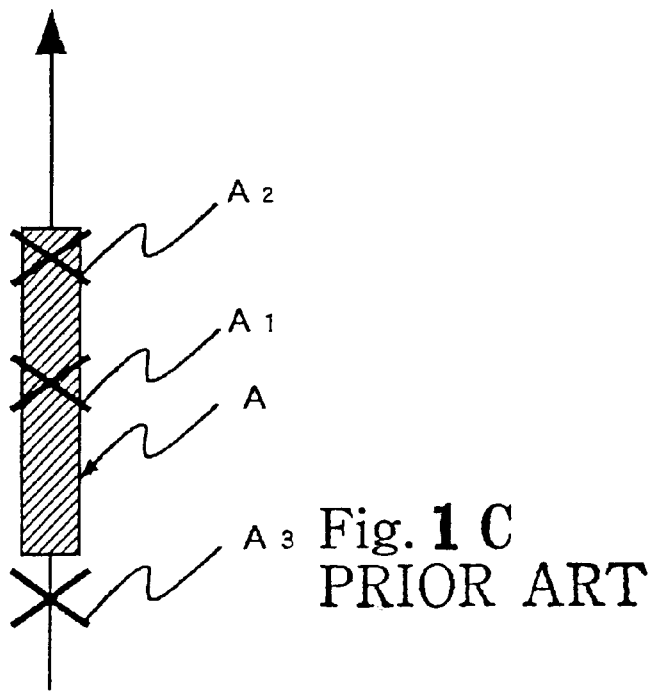
Figure 2:
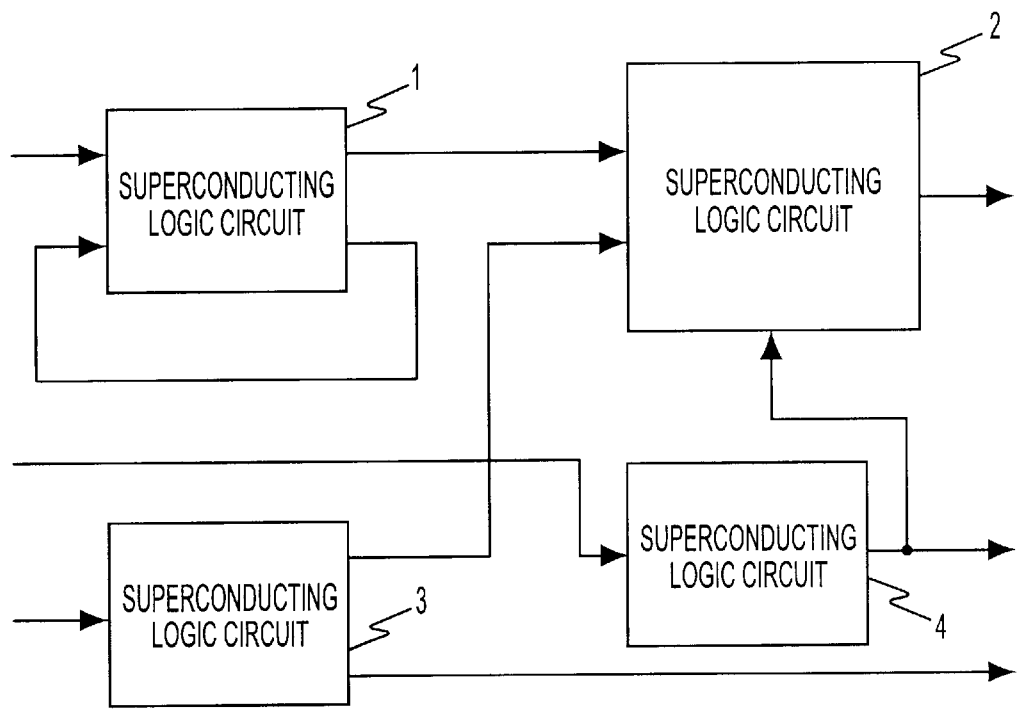
FIG. 2 is a block diagram showing the circuit configuration of an integrated circuit of superconducting circuit blocks according to the present invention.

Referring to FIG. 2 of the drawings, a three-input three-output integrated circuit embodying the present invention comprises four superconducting logic circuit blocks 1, 2, 3 and 4 and superconducting wiring strips connected thereto. The superconducting logic circuit block 1 has two input nodes and two output nodes, and one of the output nodes is connected to one of the input nodes through a feedback line. On the other hand, the superconducting logic circuit block 3 has an input node and two output nodes, and one of the output nodes serves as one of the output terminals of the integrated circuit. The superconducting logic circuit block 4 has an input node and an output node, which serves as another output terminal of the integrated circuit. The superconducting logic circuit block 2 has two input node, a control node and an output node. The input nodes of the superconducting logic circuit block 2 are connected to the output nodes of the superconducting logic circuit blocks 1 and 3, and the output node of the superconducting logic circuit block 4 is connected to the control node of the superconducting logic circuit block 2. The output node of the superconducting logic circuit block 2 serves as yet another output terminal of the integrated circuit.

The superconducting logic circuit blocks 1, 2, 3, and 4 achieve predetermined logic operation on the input signal or signals. The amount of current, which statically flows into or out of the input node/output node, is approximately equal to zero so that the change of design parameters, which have been determined for each superconducting circuit block 1/2/3/4 in the isolated state, is not required for the superconducting logic circuit blocks 1/2/3/4 when the superconducting logic circuit blocks 1/2/3/4 are integrated.

The integrated circuit shown in FIG. 2 is an example of the integrated circuit according to the present invention. The circuit configuration, number of superconducting circuit blocks and sorts of component circuit blocks are not restricted to those shown in FIG. 2.

Constant Output/Input Circuits

Figure 3:
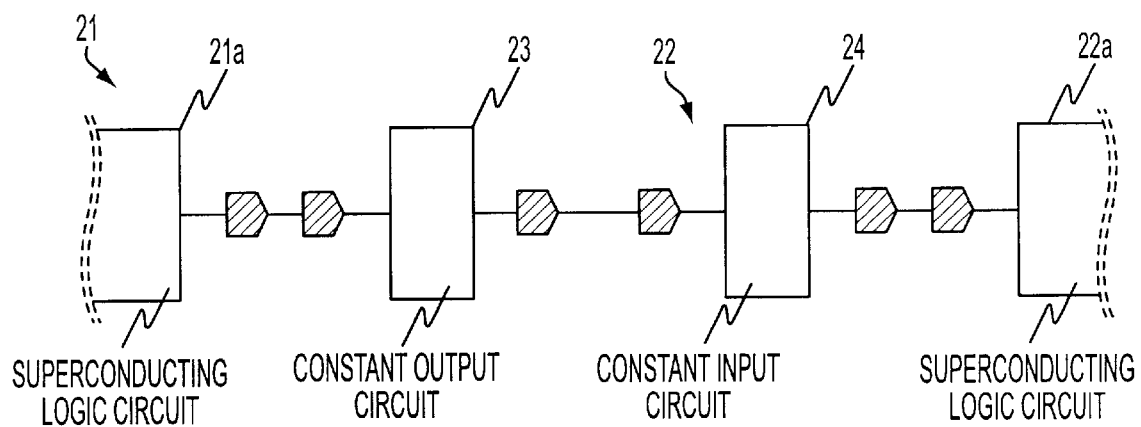
FIG. 3 is a block diagram showing a signal path incorporated in one of the superconducting circuit blocks according to the present invention.

FIG. 3 shows two superconducting circuit blocks 21/22 forming parts of the integrated circuit according to the present invention. In other words, two of the superconducting logic circuit blocks 1/2, 3/2 or 4/2 have an output node-to-input node signal path shown in FIG. 3.

The superconducting logic circuit block 21 includes a superconducting logic circuit 21a and a constant output circuit 23, and the superconducting logic circuit block 22 includes a superconducting logic circuit 22a and a constant input circuit 24. The constant output circuit 23 makes the flow-in current or flow-out current at the output node thereof to be approximately equal to zero. Similarly, the constant input circuit 24 makes the flow-in current or flow-out current at the input node thereof to be approximately equal to zero. The superconducting logic circuit 21a may have more than one output node, and the superconducting logic circuit 22a may have more than one input node. If so, the plural output nodes are respectively accompanied with plural constant output circuits 23, and the plural input nodes are respectively accompanied with plural constant input circuits 24.

Current Evaluation Circuits

FIGS. 4A and 4B show other superconducting circuit blocks 31 and 32. The superconducting circuit block 31 includes a superconducting logic circuit sub-block 31a nd an output current evaluation circuit 33. The superconducting logic circuit sub-block 31a is equivalent to the superconducting logic circuit block 21 so that the superconducting logic circuit 21a and the constant output circuit 23 are incorporated in the superconducting logic circuit sub-block 31a. On the other hand, the superconducting circuit block 32 includes a superconducting logic circuit sub-block 32a and an input current evaluation circuit 34. The superconducting logic circuit sub-block 32a is equivalent to the superconducting logic circuit block 22 so that the superconducting logic circuit 22a and the constant input circuit 24 are incorporated in the superconducting logic circuit sub-block 32a. The output current evaluation circuit 33 and the input current evaluation circuit 34 may be used in a design work, and the are disconnected from the superconducting logic circuit sub-blocks 31a and 32a upon completion of the design work. In this instance, the superconducting logic circuit sub-blocks 31a and 32a are connected to one another for forming an integration circuit.

The output current evaluation circuit 33 has an input node connected to the constant output circuit 23. The output current evaluation circuit 33 checks the output node of the constant output circuit 23 to see whether or not the amount of statically flow-in/flow-out current is approximately equal to zero. If the amount of statically flow-in/flow-out current is not approximated to zero, the output current evaluation circuit 33 regulates the parameters of the constant output circuit 23 so as to make the amount of statically flow-in/flow-out current approximately equal to zero. The input current evaluation circuit 34 is connected to the constant input circuit 24. The input current evaluation circuit 34 checks the input node of the constant input circuit 24 to see whether or not the amount of statically flow-in/flow-out current is approximately equal to zero. If the amount of statically flow-in/flow-out current is not approximated to zero, the input current evaluation circuit 34 regulates the parameters of the constant input circuit 24 so as to make the amount of statically flow-in/flow-out current approximately equal to zero.

Circuit Configurations

The constant output circuit 23 and constant input circuit 24 are hereinbelow described in detail with reference to FIGS. 5A to 5D.

The first circuit configuration of the constant output circuit 23 is shown in FIG. 5A, and is labeled with reference numeral 41. The first circuit configuration of the constant input circuit 24 is shown in FIG. 5B, and is labeled with reference numeral 42. The constant output circuit 23 with the first circuit configuration is hereinbelow denoted by the reference numeral 41, and the constant input circuit 24 with the first circuit configuration is hereinbelow denoted by the reference numeral 42.

The constant output circuit 41 comprises an inductor 411 and a Josephson junction 412. The inductor 411 is connected between the input node and the output node, and the Josephson junction 412 is connected at one end thereof to a node between the input node and the inductor 411 and at the other end thereof to the ground 413. A current source 414 is connected to a node between the inductor 411 and the output node.

When at least one parameter of the constant output circuit 41 is changed, the amount of statically flow-in/flow out current at the output node thereof is varied. This means that the amount of statically flow-in/flow-out current is decreased to zero by appropriately changing the parameter or parameters. One of the parameters is the inductance of the inductor 411, and another parameter is the critical current value in the Josephson junction 412.

In detail, when the inductance of the inductor 411 is increased under the condition that the associated superconducting logic circuit 21a operates in the operating range, the amount of the statically flow-in current is decreased at the output node of the constant output circuit 41. Similarly, when the critical current value of the Josephson junction 412 is decreased under the condition that the associated superconducting logic circuit 21a operates in the operating range, the amount of the statically flow-in current is also decreased at the output node of the constant output circuit 41. When both parameters are simultaneously changed, the amount of statically flow-in current is, of course, decreased at the output node of the constant output circuit 41.

On the contrary, when the inductance of the inductor 411 is decreased under the condition that the associated superconducting logic circuit 21a operates in the operating range, the amount of the statically flow-out current is decreased at the output node of the constant output circuit 41. Similarly, when the critical current value of the Josephson junction 412 is increased under the condition that the associated superconducting logic circuit 21a operates in the operating range, the amount of the statically flow-out current is also decreased at the output node of the constant output circuit 41. When both parameters are simultaneously changed, the amount of statically flow-out current is, of course, decreased at the output node of the constant output circuit 41.

The constant input circuit 42 comprises an inductor 421 and a Josephson junction 422. The inductor 421 is connected between the input node and the output node, and the Josephson junction 422 is connected at one end thereof to a node between the output node and the inductor 421 and at the other end thereof to the ground 423. A current source 424 is connected to a node between the inductor 421 and the input node.

When at least one parameter of the constant input circuit 42 is changed, the amount of statically flow-in/flow out current at the input node thereof is also varied. This means that the amount of statically flow-in/flow-out current is decreased to zero by appropriately changing the parameter or parameters. One of the parameters is the inductance of the inductor 421, and another parameter is the critical current value in the Josephson junction 422.

In detail, when the inductance of the inductor 421 is increased under the condition that the associated superconducting logic circuit 22a operates in the operating range, the amount of the statically flow-in current is decreased at the input node of the constant input circuit 42. Similarly, when the critical current value of the Josephson junction 412 is decreased under the condition that the associated superconducting logic circuit 22a operates in the operating range, the amount of the statically flow-in current is also decreased at the input node of the constant input circuit 42. When both parameters are simultaneously changed, the amount of statically flow-in current is, of course, decreased at the input node of the constant input circuit 42.

On the contrary, when the inductance of the inductor 421 is decreased under the condition that the associated superconducting logic circuit 22a operates in the operating range, the amount of the statically flow-out current is decreased at the input node of the constant input circuit 24. Similarly, when the critical current value of the Josephson junction 422 is increased under the condition that the associated superconducting logic circuit 22a operates in the operating range, the amount of the statically flow-out current is also decreased at the input node of the constant input circuit 24. When both parameters are simultaneously changed, the amount of statically flow-out current is, of course, decreased at the input node of the constant input circuit 24.

The second circuit configuration of the constant output circuit 23 is shown in FIG. 5C, and is labeled with reference numeral 51. The second circuit configuration of the constant input circuit 24 is shown in FIG. 5D, and is labeled with reference numeral 52. The constant output circuit 23 with the first circuit configuration is hereinbelow denoted by the reference numeral 51, and the constant input circuit 24 with the first circuit configuration is hereinbelow denoted by the reference numeral 22.

The constant output circuit 51 is implemented by an inductor 511. The inductor 411 is connected between the input node and the output node. If a circuit equivalent to the constant output circuit 41 has been incorporated in the superconducting circuit block, the constant output circuit 51 is preferable. When the parameter of the constant output circuit 51, i.e., the inductance is changed, the amount of statically flow-in/flow out current at the output node thereof is varied. This means that the amount of statically flow-in/flow-out current is decreased to zero by appropriately changing the parameter.

In detail, when the inductance of the inductor 511 is increased under the condition that the associated superconducting logic circuit 21a operates in the operating range, the amount of the statically flow-in current is decreased at the output node of the constant output circuit 51. On the contrary, when the inductance of the inductor 511 is decreased under the condition that the associated superconducting logic circuit 21a operates in the operating range, the amount of the statically flow-out current is decreased at the output node of the constant output circuit 51.

The constant input circuit 52 is also implemented by an inductor 521. The inductor 521 is connected between the input node and the output node. If a circuit equivalent to the constant input circuit 42 has been incorporated in the superconducting circuit block, the constant input circuit 42 is preferable. When the parameter of the constant input circuit 52, i.e., the inductance is changed, the amount of statically flow-in/flow out current at the input node thereof is also varied. This means that the amount of statically flow-in/flow-out current is decreased to zero by appropriately changing the parameter.

In detail, when the inductance of the inductor 521 is increased under the condition that the associated superconducting logic circuit 22a operates in the operating range, the amount of the statically flow-in current is decreased at the input node of the constant input circuit 52. On the contrary, when the inductance of the inductor 521 is decreased under the condition that the associated superconducting logic circuit 22a operates in the operating range, the amount of the statically flow-out current is decreased at the input node of the constant input circuit 52.

The constant output circuit 41 and constant input circuit 42 may be respectively combined with the constant input circuit 52 and constant output circuit 51. The constant output circuit 41 is connected to the constant input circuit 52 in a signal path, and the constant output circuit 51 is connected to the constant input circuit 42 in another signal path.

Figure 6:
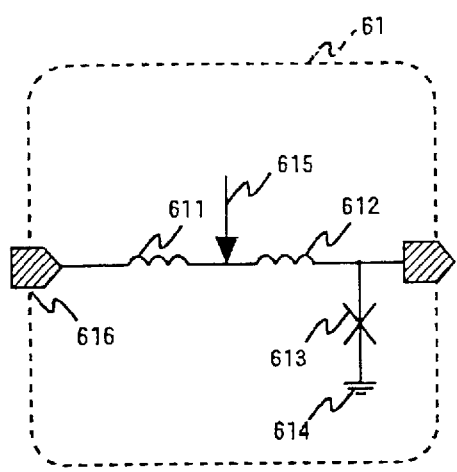
FIG. 6A is a circuit diagram showing the circuit configuration of an output current evaluation circuit incorporated in a signal path of the integrated circuit.
FIG. 6B is a circuit diagram showing the circuit configuration of an input current evaluation circuit incorporated in a signal path of the integrated circuit.
Figure 6:
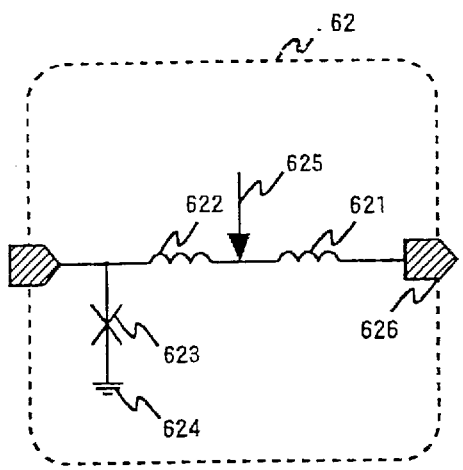

FIGS. 6A and 6B show a circuit configuration of the output current evaluation circuit 33 and a circuit configuration of the input current evaluation circuit 34. The output current evaluation circuit 22 with the circuit configuration shown in FIG. 6A and the input current evaluation circuit 34 with the circuit configuration shown in FIG. 6B are hereinbelow referred to as "output current evaluation circuit 61" and "input current evaluation circuit 62", respectively.

The output current evaluation circuit 61 comprises a series of inductors 611 and 612 and a Josephson junction 613. The series of inductors 611/612 is connected between an input node 616 of the output current evaluation circuit 61 and an output node, and the Josephson junction 613 is connected at one end thereof to a ground 614 and at the other end thereof to a node between the inductor 612 and the output node. The inductor 611 is closer to the input node than the other inductor 612. A current source 615 is connected to a node between the inductors 611 and 612.

The input current evaluation circuit 62 also comprises a series of inductors 622 and 621 and a Josephson junction 623. The series of inductors 622/621 is connected between an input node and an output node of the input current evaluation circuit 62, and the Josephson junction 623 is connected at one end thereof to a ground 624 and at the other end thereof to a node between the input node and the inductor 622. The inductor 621 is closer to the output node than the other inductor 622. A current source 625 is connected to a node between the inductors 622 and 621.

Using the output current evaluation circuit 61 and input current evaluation circuit 62, the statically flow-in and statically flow-out current at the output node and input node of a superconducting circuit block is evaluated as follows.

First, the input node 616 of the output current evaluation circuit 61 is connected to the output node 626 of the input current evaluation circuit 62. Subsequently, an analyst looks for appropriate values of parameters of the output current evaluation circuit 61 and/or appropriate values of parameters of the input current evaluation circuit 62 at which the amount of current flowing through the inductor 611 and 621 is zero. The parameters of the output current evaluation circuit 61 are the inductance of the inductor 611, the inductance of the inductor 612, the critical current value of the Josephson junction 613 and the amount of supply current from the current source 615. Similarly, the parameters of the input current evaluation circuit 62 are the inductance of the inductor 621, the inductance of the inductor 622, the critical current value of the Josephson junction 623 and the amount of supply current from the current source 625. When the analyst finds them, the parameters are fixed to the values at which the amount of current flowing through the inductors 611 and 621 is zero, and are never changed. It is guaranteed that the amount of current flowing through the inductors 611 and 621 is zero in the combination of the output current evaluation circuit 61 and the input current evaluation circuit 62 and that the potential level at the input node 616 of the output current evaluation circuit 61 is equal to the potential level at the output node 626 of the input current evaluation circuit 62 in so far as the parameters are fixed to the values which have been already found. The potential level at the input node/output node 616/626 is expressed as V0.

Subsequently, the output current evaluation circuit 61 is connected to the output node of the superconducting circuit sub-block 31a as shown in FIG. 4A. The superconducting circuit sub-block 31a and output current evaluation circuit 61 are put in operation, and the amount of current statically passing through the inductor 611 is measured. If the amount of current at the output node of the superconducting circuit sub-block 31a is not zero, the parameters of the constant output circuit 23 is varied in such a manner that the amount of flow-in/flow-out current at the output node is approximately equal to zero.

When the parameters of the constant output circuit 23 are fixed to appropriate values, the amount of static current flowing between the superconducting circuit sub-block 31a and the output current evaluation circuit 61 is approximately equal to zero, and the potential level at the output node of the superconducting circuit sub-block 31a is approximately equal the potential level at the input node 616, i.e., V0.

Using the input current evaluation circuit 62, it is possible to minimize the amount of statically flow-in/flow-out current at the input node of the superconducting circuit sub-block 32a. In detail, the output node 626 of the input current evaluation circuit 62 is connected to the input node of the superconducting circuit sub-block 32a as shown in FIG. 4B. The superconducting circuit sub-block 32a and the input current evaluation circuit 62 are put in operation, and the amount of current statically flowing through the inductor 621 is measured. If the amount of current at the input node of the superconducting circuit sub-block 32a is not zero, the parameters of the constant input circuit 24 is varied in such a manner that the amount of flow-in/flow-out current at the input node is approximately equal to zero.

When the parameters of the constant input circuit 24 are fixed to appropriate values, the amount of static current flowing between the superconducting circuit sub-block 32a and the input current evaluation circuit 62 is approximately equal to zero, and the potential level at the input node of the superconducting circuit sub-block 32a is approximately equal the potential level at the output node 626, i.e., V0.

As will be understood, the output current evaluation circuit 33 makes the potential level at the output node of the superconducting circuit sub-block 31a approximately equal to V0, and the input current evaluation circuit 34 makes the potential level at the input node of the superconducting circuit sub-block 32a approximately equal to V0. After the adjustment of the parameters to the appropriate values, the output node of the superconducting circuit sub-block 31a is directly connected to the input node of the superconducting circuit sub-block 32a. The potential level at the output/input nodes of the superconducting circuit sub-blocks 31a/32a is V0, and the amount of statically flow-in/ flow-out current is approximately equal to zero.

Evaluation

Figure 7:
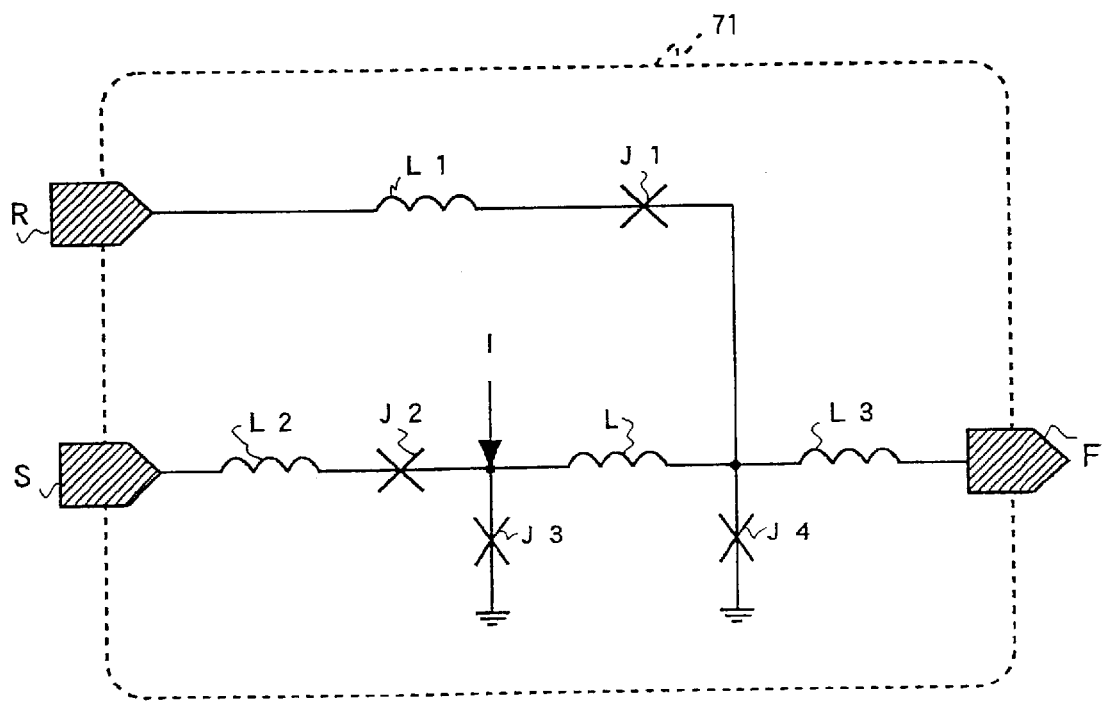
FIG. 7 is a circuit diagram showing the circuit configuration of the prior art R-S flip flop circuit disclosed in the paper.

FIG. 7 shows the circuit configuration of the R-S flip-flop 71 disclosed in the paper, i.e., "RSFQ Logic/Memory Family: A New Josephson-Junction Technology for Sub-Terahertz- Clock- Frequency Digital Systems", IEEE Transactions on Applied Superconductivity, vol. 1, No. 1, page 7, March 1991.

The prior art R-S flip flop circuit 71 comprises inductors L1, L2, L3 and L and Josephson junctions J1, J2, J3 and J4. Current source I is connected to a node between the Josephson junction J2 and the inductor L. The inductance of the inductors L1/L2/L3 is adjusted to 5.2 pH, and the inductor L has the inductance of 13 pH. The critical current value of the Josephson junctions J1/J2 is 142 $\mu$A, and the critical current value of the Josephson junctions J3/J4 is 200 $\mu$A. The current source I supplies the current of 140 $\mu$A.

The present inventors evaluated the prior art R-S flip flop circuit 71 through an analog simulation on the above-described parameters. The amounts of statically flow-in current at the input nodes R and S were 17.9 $\mu$A and 2.03 $\mu$A, respectively. On the other hand, the amount of statically flow-out current at the output node F was −24.2 $\mu$A which was equivalent to the flow-in current of 24.2 $\mu$A. Thus, excess current, the amount of which was more than 10% of the critical current value, was supplied to the Josephson junction J4.

Figure 8:
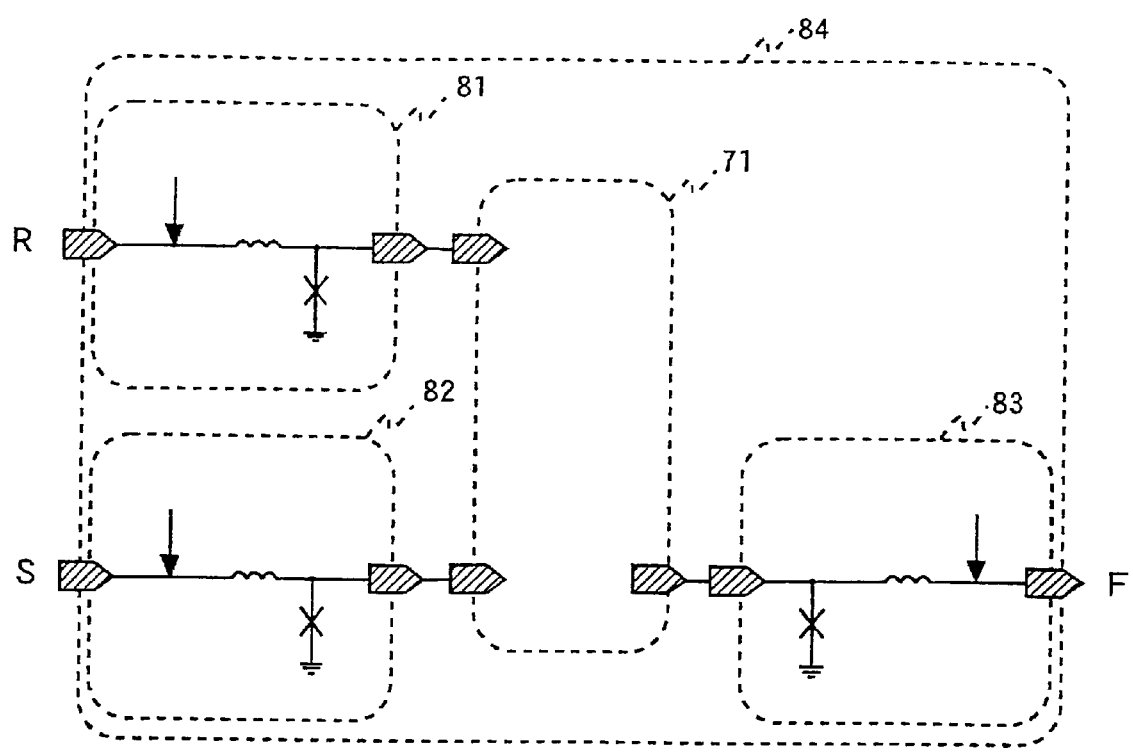
FIG. 8 is a circuit diagram showing the circuit configuration of an R-S flip flop circuit according to the present invention.

The present inventors fabricated an R-S flip flop circuit 84 on the basis of the prior art R-S flip flop circuit 71 as shown in FIG. 8. A constant output circuit 83 was connected between the R-S flip flop circuit 71 and the output node F, and two constant input circuits 81/82 were connected between the input nodes R/S and the R-S flip flop circuit 71. The constant output circuit 83 was identical in circuit configuration with the constant output circuit 41, and the constant input circuits 81/82 were identical in circuit configuration with the constant input circuit 42.

The present inventors prepared the output current evaluation circuit 61 shown in FIG. 6A and the input current evaluation circuit 62 shown in FIG. 6B for the evaluation. The input node 616 of the output current evaluation circuit 61 was connected to the output node 626 of the input current evaluation circuit 62. The present inventors equalized the parameters of the output current evaluation circuit 61 with the parameters of the input current evaluation circuit 62. The inductance of the inductors 611 and 621 was 2.6 pH, and the inductance of the inductors 612 and 622 was 0.0001 pH. The critical current value of the Josephson junctions 613/623 was 200 $\mu$A, and each of the current sources 615/625 supplied the current of 140 $\mu$A to the node. The equalization of parameters made the amount of current flowing through the inductors 612/622 equal to zero, because the output current evaluation circuit 61 was symmetrical with the input current evaluation circuit 62. The present inventors confirmed that the amount of current was zero.

Subsequently, the output current evaluation circuit 61 was connected to the output node F, and the input current evaluation circuits 62 were connected to the input nodes R and S. The present inventors looked for appropriate values of the parameters in the constant input circuits 81/82 and appropriate values of the parameters in the constant output circuit 83 at which the amounts of current flowing through the inductors of the evaluation circuits 81/82 and 83 are approximately equal to zero. The appropriate values of the parameters were determined as follows. The critical current value of each Josephson junction 812/822/832 was 200 $\mu$A; the amount of current flowing out from each current source 814/824/834 was 140 $\mu$A; the inductance of the inductor 811 was 2.82 pH; the inductance of the inductor 821 was 2.58 pH; the inductance of the inductor 831 was 2.95 pH.

The present inventors evaluated the R-S flip flop circuit 84 through the analog simulation on the parameters. The amounts of statically flow-in current at the input nodes R/S were −0.0089 $\mu$A and 0.037 $\mu$A, and the amount of statically flow-out current at the output node F was −0.054 $\mu$A. Thus, the statically flow-in/flow-out current was negligible, and the reduction ratio was nearly equal to 100%.

The constant input circuit 81/82 and constant output circuit 83 did not have any undesirable influence on the operation of the R-S flip flop circuit 84.

As will be appreciated from the foregoing description, the constant input circuit and constant output circuit make the statically flow-in current and statically flow-out current approximately equal to zero at the input node and output node of the superconducting circuit block according to the present invention.

Moreover, the set of input current evaluation circuit and output current evaluation circuit makes the regulation work on the parameters of the constant input circuit and constant output circuit simple so that the superconducting logic circuits are integrated together within a short time period.

Although particular embodiments of the present invention have been shown and described, it will be apparent to those skilled in the art that various changes and modifications may be made without departing from the spirit and scope of the present invention.

For example, the constant input/output circuits may be incorporated in any sort of superconducting circuit block for a digital operation. Several examples of the superconducting circuit blocks are disclosed in the prior art papers, and the present invention is applicable to those sorts of superconducting circuit blocks.

What is claimed is:

1. An integrated circuit comprising
    a first superconducting circuit block including an output node, a first superconducting circuit for a certain function and a constant output circuit connected between an output node of said first superconducting circuit and said output node and making the amount of statically flow-in or flow-out current at an output node of said first superconducting circuit approximately equal to zero, and
    a second superconducting circuit block including an input node, a second superconducting circuit for a certain function and a constant input circuit connected between said input node and an input node of said second superconducting circuit and making the amount of statically flow-in or flow-out current at said input node of said second superconducting circuit approximately equal to zero.

2. The integrated circuit as set forth in claim 1, in which said constant output circuit includes an inductor connected between an input node thereof and an output node thereof, a Josephson junction connected at one end thereof to between said input node thereof and said inductor and at the other end thereof to a constant potential source and a current supply line connected to between said inductor and said output node thereof.

3. The integrated circuit as set forth in claim 1, in which said constant input circuit includes an inductor connected between an input node thereof and an output node thereof, a Josephson junction connected at one end thereof to between said inductor and said output node thereof and at the other end thereof to a constant potential source and a current supply line connected to between said input node thereof and said inductor.

4. The integrated circuit as set forth in claim 1, in which said constant output circuit includes a first input node, a first output node, a first inductor connected between said first input node and said first output node thereof, a first Josephson junction connected at one end thereof to between said first input node and said first inductor and at the other end thereof to a constant potential source and a first current supply line connected to between said first inductor and said first output node thereof, and said constant input circuit includes a second input node, a second output node, a second inductor connected between said first input node and said second output node, a second Josephson junction connected at one end thereof to between said second inductor and said second output node and at the other end thereof to said constant potential source and a second current supply line connected to between said second input node and said second inductor.

5. The integrated circuit as set forth in claim 1, in which said constant output circuit includes an inductor connected between an input node thereof and an output node thereof.

6. The integrated circuit as set forth in claim 1, in which said constant input circuit includes an inductor connected between an input node thereof and an output node thereof.

7. The integrated circuit as set forth in claim 1, in which said constant output circuit includes a first inductor connected between an input node thereof and an output node thereof, and said constant input circuit includes a second inductor connected between an input node thereof and an output node thereof.

8. The integrated circuit as set forth in claim 1, in which said first superconducting circuit is a two-input one-output circuit so that said first superconducting circuit block has a first input node connected to another constant input circuit, a second input node connected to yet another constant input circuit and an output node connected to said constant output circuit.

9. The integrated circuit as set forth in claim 8, in which said two-input one-output circuit is an R-S flip flop circuit.

10. A method of designing an integrated circuit of superconducting circuit blocks, comprising the steps of:
    a) determining a first superconducting circuit block having a constant output circuit, a second superconducting circuit block having a constant input circuit, an output current evaluation circuit and an input current evaluation circuit;
    b) determining parameters of said output current evaluation circuit and parameters of said input current evaluation circuit in such a manner that the amount of current is approximately equal to zero at an output node of said output current evaluation circuit connected to an input node of said input current evaluation circuit;
    c) separating said output current evaluation circuit from said input current evaluation circuit;
    d) connecting an input node of said output current evaluation circuit and an output node of said input current evaluation circuit to an output node of said constant output circuit and an input node of said constant input circuit, respectively;
    e) determining parameters of said constant output circuit and parameters of said constant input circuit in such a manner that the amounts of current are approximately equal to zero at said output node of said constant output circuit and at said input node of said constant input circuit, independently;
    f) disconnecting said output current evaluation circuit and said input current evaluation circuit from said constant output circuit and said constant input circuit, respectively; and
    g) connecting said output node of said constant output circuit to said input node of said constant input circuit so as to integrate said first superconducting circuit block and said second superconducting circuit block together.

11. The method as set forth in claim 10, in which said output current evaluation circuit includes a first input node, a first output node, a first inductor connected at one end thereof to said first input node, a second inductor connected between the other end of said first inductor and said first output node, a first Josephson junction connected at one end thereof to between said second inductor and said first output node and at the other end thereof to a constant potential source and a first current supply line connected to between said first inductor and said second inductor so that said parameters determined at said step b) are inductances of said first and second inductors, a critical current value of said first Josephson junction and the amount of current supplied through said first current supply line, and said input current evaluation circuit includes a second input node, a second output node, a third inductor connected at one end thereof to said second input node, a fourth inductor connected between the other end of said third inductor and said second output node, a second Josephson junction connected at one end thereof to between said second input node and said third inductor and at the other end thereof to said constant potential source and a second current supply line connected to between said third inductor and said fourth inductor so that said parameters determined at said step b) are inductances of said third and fourth inductors, a critical current value of said second Josephson junction and the amount of current supplied through said second current supply line.

12. The method as set forth in claim 11, in which said first inductor and said second inductor are approximately equal in inductance to said fourth inductor and said third inductor, respectively, said first Josephson junction is approximately equal in critical current value to said second Josephson junction, and said first current supply line supplies current approximately equal in amount to the current supplied from said second current supply line.

13. The method as set forth in claim 10, in which said constant output circuit includes a first input node, a first output node, a first inductor connected between said first input node and said first output node, a first Josephson junction connected at one end thereof to between said first input node and said first inductor and at the other end thereof to a constant potential source and a first current supply line connected to between said first inductor and said first output node thereof so that said parameters determined at said step e) are the inductance of said first inductor, a critical current of said first Josephson junction and the amount of current supplied from said first current supply line, and said constant input circuit includes a second input node, a second output node, a second inductor connected between said second input node and said second output node, a second Josephson junction connected at one end thereof to between said second inductor and said second output node and at the other end thereof to said constant potential source and a second current supply line connected to between said second input node thereof and said second inductor so that so that said parameters determined at said step e) are the inductance of said second inductor, a critical current of said second Josephson junction and the amount of current supplied from said second current supply line.

* * * * *